United States Patent [19]
Kotooka et al.

[11] Patent Number: 6,117,402
[45] Date of Patent: Sep. 12, 2000

[54] DEVICE FOR MANUFACTURING SINGLE CRYSTALS

[75] Inventors: Toshirou Kotooka; Yoshiyuki Shimanuki; Makoto Kamogawa, all of Hiratsuka, Japan

[73] Assignee: Komatsu Electronic Metals Co., Ltd., Kanagawa, Japan

[21] Appl. No.: 09/287,232

[22] Filed: Apr. 6, 1999

[30] Foreign Application Priority Data

Apr. 8, 1998 [JP] Japan .................................. 10-111352

[51] Int. Cl.$^7$ ............................. B01D 9/00; C30B 35/00
[52] U.S. Cl. ...................................... 422/245.1; 117/217
[58] Field of Search ................................. 117/204, 200, 117/217; 422/245.1

[56] References Cited

U.S. PATENT DOCUMENTS 5,567,399  10/1996  Von Ammon et al. .............. 422/245.1
6,036,776   3/2000  Kotooka et al. ........................ 117/217

Primary Examiner—Benjamin L. Utech
Assistant Examiner—Matthew Anderson
Attorney, Agent, or Firm—Beyer Weaver & Thomas, LLP

[57] ABSTRACT

This invention provides a device for manufacturing single crystals provided with an after-cooler that causes an abrupt temperature gradient along the axis of the crystal being lifted. The device according to this invention can further increase the lifting speed of single crystals. The after-cooler (4) is disposed between the single crystal (5) being lifted and the heat-shield plate (1). Both the inner surface facing the single crystal (5) and the outer surface facing the heat-shield plate (1) of the after-cooler have a surface emissivity value larger than 0.6. Furthermore, the after-cooler (4) is made of cooling pipes or cooling jackets, and the surfaces of the after-cooler (4) are treated by oxidizing or nitriding so as to increase their emissivity values.

2 Claims, 6 Drawing Sheets

DEVICE FOR MANUFACTURING SINGLE CRYSTALS

BACKGROUND OF THE INVENTION

1. Field of the Invention

This invention relates to a device for manufacturing single crystals by the CZ (Czochralski) method.

2. Description of Prior Art

Conventionally, single crystal silicon is produced by the CZ method in a single-crystal manufacturing apparatus shown in FIG. 6. The lower portion of the single-crystal manufacturing apparatus is a chamber 6, and a crucible 7 is disposed at the central portion of the chamber 6 in a manner capable of rotating and ascending/descending. The crucible 7 consists of a quartz crucible 7b and a graphite crucible 7a in which the quartz crucible 7b is accommodated. Polycrystalline silicon is deposited into the quartz crucible 7b so as to be heated to melt into a melted liquid 9 by way of a cylindrical heater 8 disposed around the crucible 7. Subsequently, a seed crystal installed within a seed holder 10 is dipped into the melted liquid 9. Afterward, the seed holder 10 and the crucible 7 are respectively driven to rotate in the same or reverse directions. At the same time, the seed holder 10 is lifted to grow a single-crystal silicon 5 (hereinafter referred as the single crystal) with predetermined diameter and length. Furthermore, a keep-warm cylinder 11 is disposed around the cylindrical heater 8.

To enhance the productivity of single-crystal manufacturing, it is necessary to rapidly cool down single crystals and to increase the lifting speed of single crystals. To reach this end, as shown in FIG. 6, a heat-shield plate 12 is disposed around the lifting zone of the single crystal 5. The heat-shield plate 12 consists of a ring-shaped rim 12a, an adiabatic duct 12b in the shape of a reversed truncated cone whose diameter decreases from its upper end toward its bottom. The heat-shield plate 12 is used for shielding the single crystal 5 from heat radiating from the crucible 7 or the heater 8. Especially, the heat-shield plate 12 is used for amplifying the temperature gradients in the longitudinal and the radial directions in the region near the solid-liquid boundary. Furthermore, the heat-shield plate 12 plays the role of guiding the inert gas coming from above the chamber 6 into the surroundings of the single crystal 5 and expelling gases hindering single-crystallization, such as SiO, $SiO_2$, Si, or metal vapors coming from the graphite crucible 7a. This can improve the feasibility of dislocation-free crystals.

However, in the process of lifting single crystals by utilizing conventional heat-shield plates, it is not sufficient to shield the radiation heat coming from melt surface, the heater, or crucible to the single crystal. Thus, the lifting speed is restrained. To solve the problem, a cooling body (hereinafter referred as an after-cooler) consisting of cooling pipes or cooling jackets surrounding the single crystal being lifted disposed between the single crystal and the heat-shield plate has been suggested. However, the after-cooler should be made of material with high coefficient of thermal conductivity and not cause any contamination to the melted liquid or single crystals.

Conventional after-coolers installed in single-crystal manufacturing devices, for example, the cooling cylinder installed in the single-crystal manufacturing device disclosed in JP-A 4-317491 (JP-A: Japanese unexamined Patent Publication), comprise an outer cylinder facing the heater made of material having a low emissivity value, such as mirror-polished SUS or Molybdenum, and an inner cylinder facing the single crystal being lifted and fabricated from parts having a high emissivity value, such as copper pipes warped into a spiral shape. Furthermore, as described in the single-crystal manufacturing device disclosed in JP-A 8-239291, an after-cooler comprises a duct system for circulating liquid coolant, and a cooling body disposed underneath the duct system. The cooling body is made of silver or at least coated with silver. In alternative embodiments, the inner surface of the after-cooler facing the single crystal can be coated with black color so as to absorb the incident radiation heat, and the outer surface of the after-cooler facing the heat-shield plate may be, for example, mirror-polished or overlaid with gold so as to reflect the incident radiation heat.

However, the above conventional after-cooler has the following drawbacks:

(1) In the cooling cylinder installed in the single crystal manufacturing device disclosed in JP-A 4-317491, copper pipes are used as the inner cylinder. However, it is known that copper forms nuclei of crystal defects. If copper is used as the material of after-coolers, it will become a contamination source within the furnace. This will reduce the device yield.

(2) In the single-crystal manufacturing device disclosed in JP-A 8-239291, the outer surface of the cooling body facing the heat-shield plate is mirror-polished or overlaid with gold so as to reduce its emissivity value. The heat-absorption capacity of the above cooling body is lower than that of the cooling body made of high-emissivity-value material. This keeps the surroundings of the heat-shield plate and the upper end portion of the heater at a high temperature. As a result, the temperature gradient within the hot zone is reduced and the temperature gradient in the single crystal axis decreases. Accordingly, the crystal lifting speed declines.

SUMMARY OF THE INVENTION

In view of the above disadvantages, the object of the present invention is to provide a device for manufacturing single crystals with the aid of an after-cooler capable of effectively performing heat transfer in the process of lifting single crystals, thereby causing an abrupt temperature gradient along the axis of the crystal being lifted and allowing a substantial increase in the lifting speed of the single crystal.

To achieve the above object, the single-crystal manufacturing device according to the first embodiment of this invention is provided with a heat-shield plate surrounding the single crystal being lifted. An after-cooler, of which both the inner surface facing the single crystal and the outer surface facing the heat-shield plate have surface emissivity value larger than 0.6, is disposed between the single crystal being lifted and the heat-shield plate.

According to the structure of the above single-crystal manufacturing device, in addition to the heat-shield plate, the single-crystal manufacturing device has an after-cooler whose surface emissivity value is larger than 0.6. The inner and outer surfaces of the after-cooler can absorb the heat radiation emitted from the single crystal being lifted or the heat-shield plate, thus cooling down the single crystal being lifted. Therefore, the temperature gradient along the axis of the single crystal grows much larger than in conventional devices.

The single-crystal manufacturing device according to the second embodiment of this invention is characterized in that the after-cooler as described in the single-crystal manufacturing device according to the first embodiment is made of cooling pipes or cooling jackets, and the surfaces of the after-cooler are treated by oxidizing or nitriding so as to increase their emissivity values.

Copper causes contamination to the melted liquid or single crystals and can not be used as the material of the after-cooler. Therefore, when using stainless steel as the material of the cooling pipes or the cooling jackets, for example, the emissivity value can reach a value larger than 0.6 if the surfaces of the after-cooler are treated by oxidizing or nitriding. Thus, it is easy for the after-cooler to absorb the heat radiation emitted from the single crystal being lifted or the heat-shield plate.

BRIEF DESCRIPTION OF THE DRAWINGS

The present invention can be more fully understood from the subsequent detailed description and examples with reference to the accompanying drawings, wherein.

DETAILED DESCRIPTION OF THE PREFERRED EMBODIMENT

The following is a description of embodiments of the single-crystal manufacturing device according to this invention with reference to the drawings. Identical numeral references are designated to the same components in both this invention and the above-described conventional device.

Figure 1:
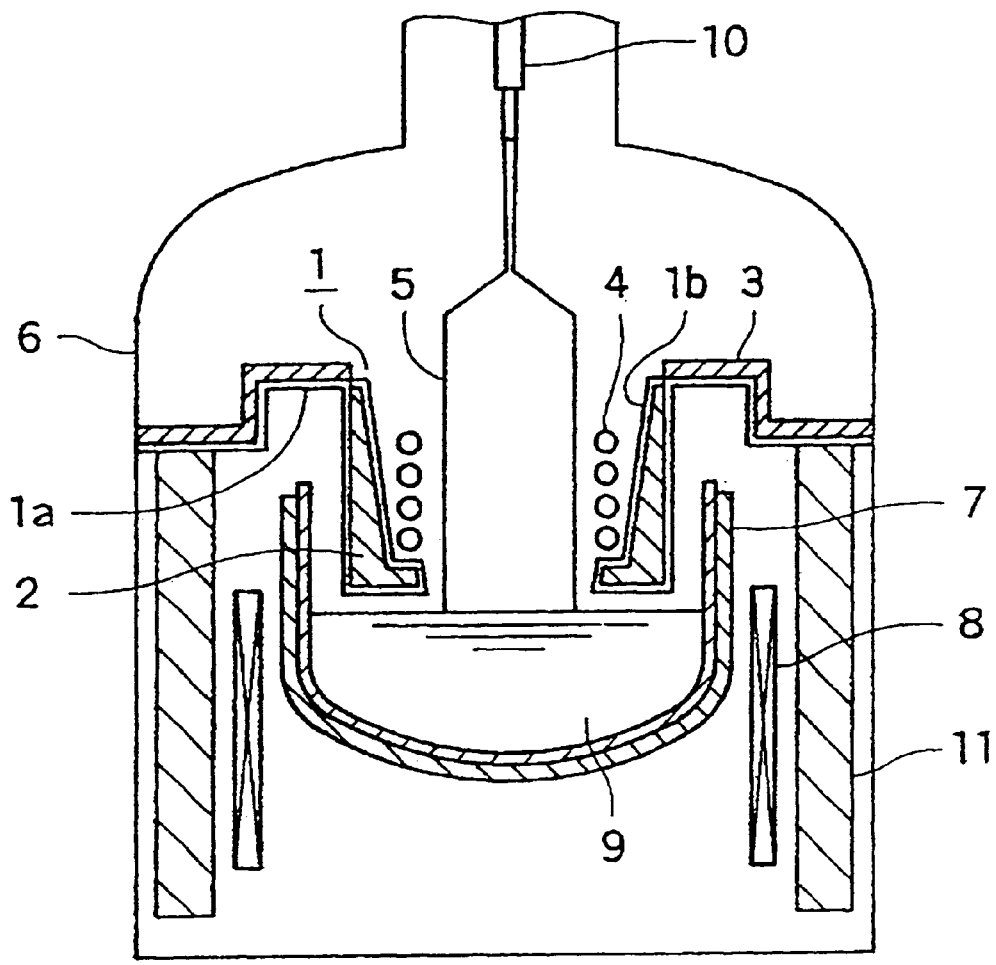
FIG. 1 is a schematic cross-sectional view showing an outline structure of the lower portion of a single-crystal manufacturing device according to this invention.
Figure 2:
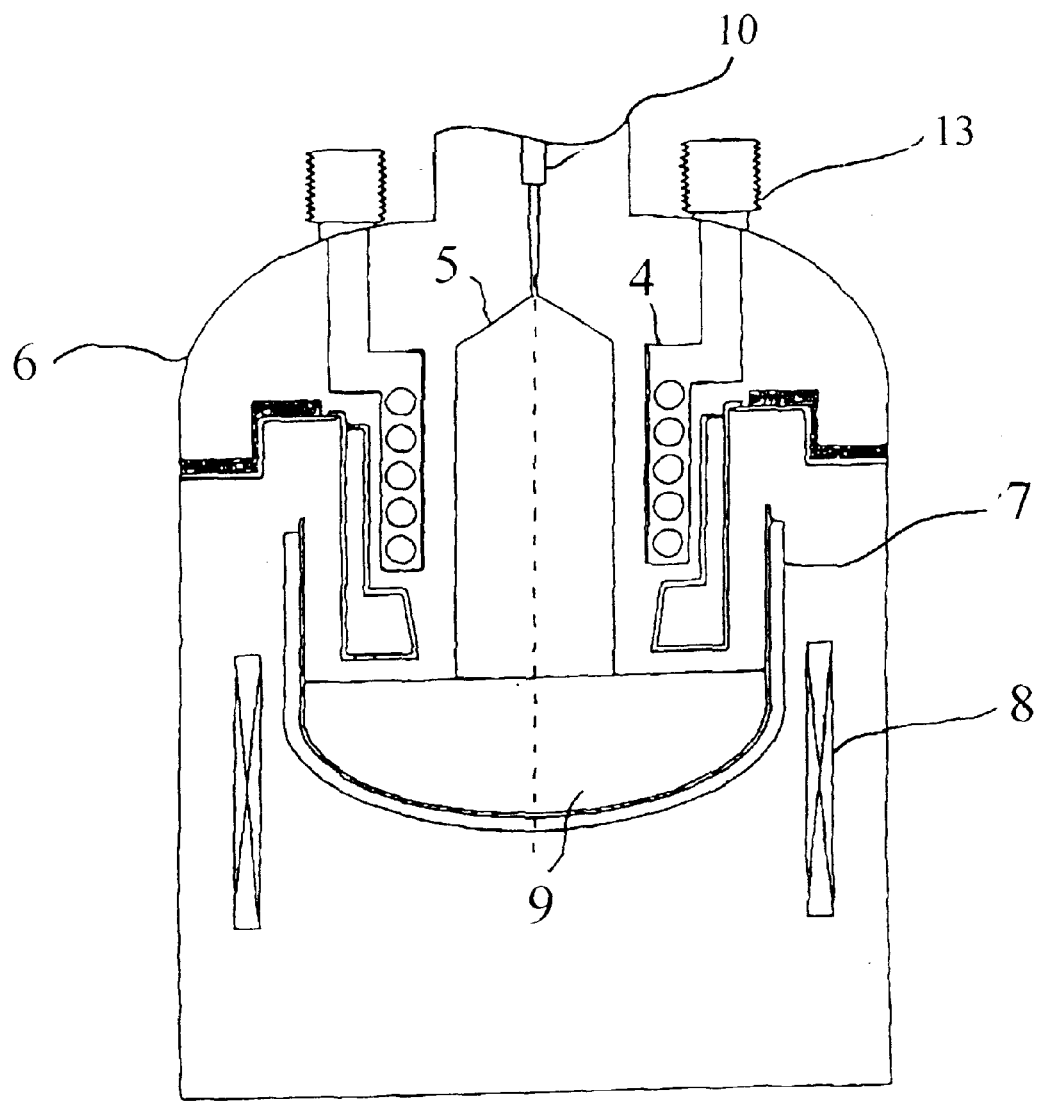
FIG. 2 is a schematic drawing showing an after-cooler having ascending/descending mechanism according to this invention.
Figure 3:
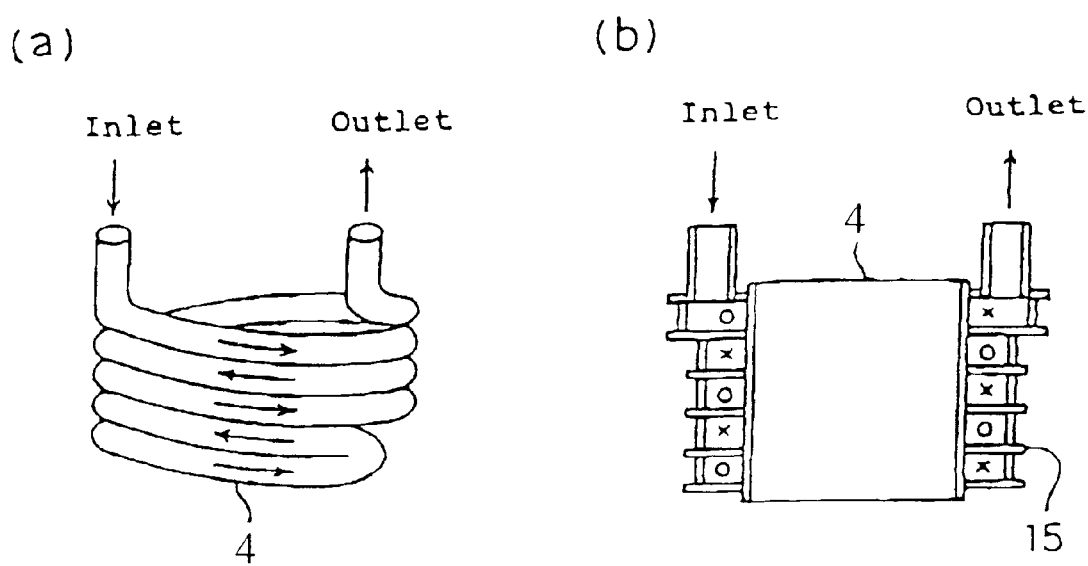
FIG. 3a is a perspective view showing the piping of cooling water in the after-cooler according to the first embodiment of this invention.
FIG. 3b is a perspective view showing the jacket-type piping of cooling water in the after-cooler according to the second embodiment of this invention.
Figure 6:
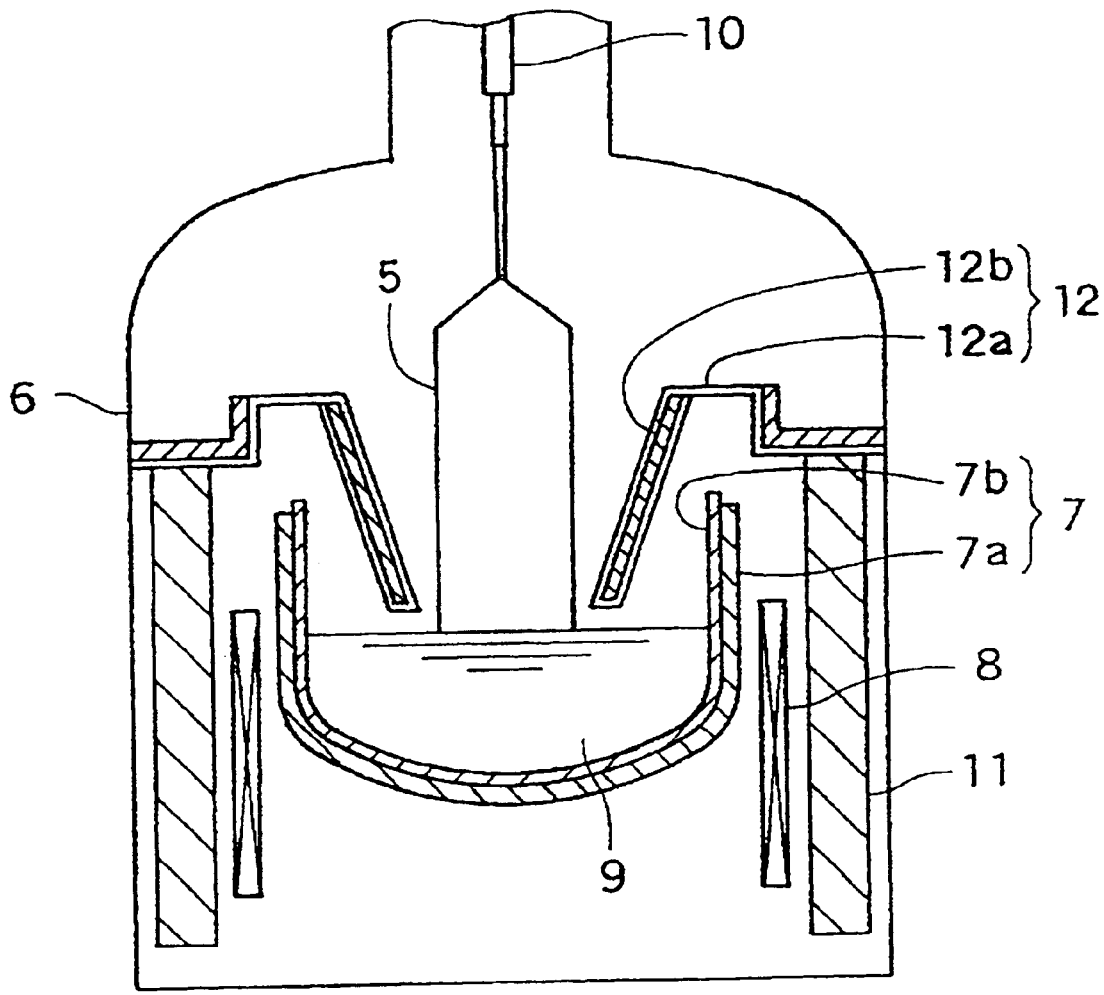
FIG. 6 is a schematic cross-sectional view showing an outline structure of the lower portion of a conventional single-crystal manufacturing device.

FIG. 1 is a schematic cross-sectional view showing an outline structure of the lower portion of a single-crystal manufacturing device according to this invention. As shown in FIG. 1, a heat-shield plate 1 comprises a ring-shaped rim 1a covering above the hot zone and an adiabatic cylinder 1b extending downward from the inner end portion of the ring-shaped rim 1a. The outer wall of the adiabatic cylinder 1b is in the shape of a cylinder. The inner portion of the adiabatic cylinder 1b is in the shape of a transformational tapered hole with a horizontal step formed on its inner surface, and the diameter of the upper opening of the adiabatic cylinder 1b is larger than that of the lower opening. The inner space of the adiabatic cylinder 1b is filled with adiabatic material 2 made of, for example, carbon fibers. Furthermore, an adiabatic part 3 made of a material such as carbon fibers is affixed on the rim 1a. The shape of the adiabatic cylinder 1b is not limited to that shown in FIG. 1: it can be a shape similar to that shown in FIG. 1 or that in the conventional device shown in FIG. 6.

An after-cooler 4 made of stainless steel pipes is disposed within the adiabatic cylinder 1b of the heat-shield plate 1. A helical cooling pipe surrounding the single crystal 5 being lifted constructs the after-cooler 4. The surface of the after-cooler 4 is treated by oxidizing or nitriding. In other words, the after-cooler 4 is treated by, for example, dipping it into a heated mixture of chromic acid solution and sulfuric acid solution so as to form an oxide film on its surface (the so called Inco method). The after-cooler 4 can also be treated by forming a nitride film on its surface by the molten salt dipping method (Tufftride treatment) or gas soft nitriding method, or by galvanizing with material such as black chrome, black nickel, or zinc. Importantly, the structure of the oxide film or the nitride film formed through the Inco method or the Molten-Salt-Dipping method is dense. Therefore, even if the film grows thicker at a high temperature during CZ process, the film will not come off in the CZ furnace (in which, it is known, cleanness is strictly required). The emissivity value of the after-cooler can be improved to 0.60–0.9.

Figure 4:
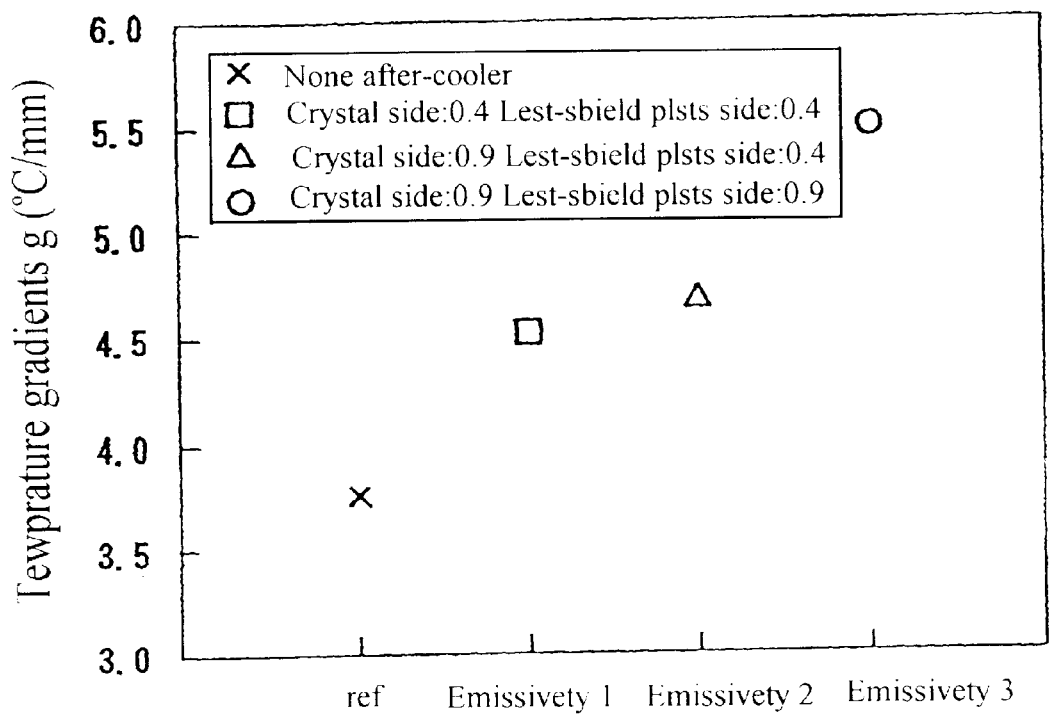
FIG. 4 is a chart showing the correlation between temperature gradients along the axis of the single crystal and emissivity value of the after-cooler.
Figure 5:
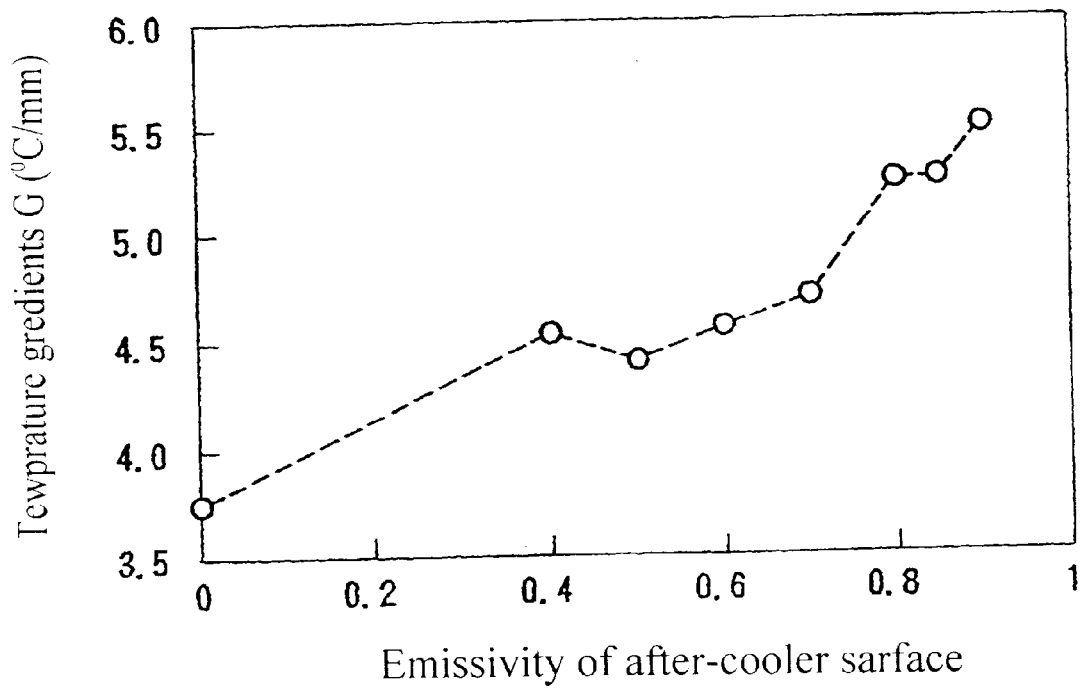
FIG. 5 is a chart showing the correlation between temperature gradients along the axis of the single crystal and emissivity value of the after-cooler.

The relationship between the emissivity value of the after-cooler and the temperature gradient in the single crystal being lifted has been measured and the results are shown in FIGS. 4 and 5. Three after-coolers with different surface emissivity values are used. FIG. 4 shows temperature gradients G measured at temperatures ranging from the melting point to 1300° C. along the axis of the single crystal being lifted by a single-crystal manufacturing device provided with the three after-coolers. For comparison, temperature gradient measured within an after-cooler is also shown in addition to the above results. The results measured in the device without an after-cooler having been installed is denoted as ref.

The emissivity value of stainless steel is ordinarily around 0.3. However, the stainless steel used for producing after-coolers is not processed with any surface-treatment and its emissivity value is around 0.4. Thus, it is acceptable to take the minimum emissivity value as 0.4, and the emissivity value can be improved to a maximum 0.9. For comparison, the maximum emissivity value and the minimum emissivity value were respectively set at values of 0.9 and 0.4, and results employing the above two extremity values are shown in FIG. 4. Furthermore, in order to check the assumption whether heat transfer improves or not if the emissivity value of the surface facing the crystal is increased to its maximum extent and the emissivity value of the surface facing the heat-shield plate is decreased, an embodiment in which the emissivity value of the surface facing the crystal is set at a value of 0.9 and the emissivity value of the surface facing the heat-shield plate is set at a value of 0.4 has been annexed.

Referring to FIG. 4, the emissivity value of the surface facing the crystal was set at a value of 0.4 and the emissivity value of the surface facing the heat-shield plate was set at a value of 0.4 for level 1; for level 2, the emissivity value of the surface facing the crystal was set at a value of 0.9 and the emissivity value of the surface facing the heat-shield plate was set at a value of 0.4; and for level 3, the emissivity value of the surface facing the crystal was set at a value of 0.9 and the emissivity value of the surface facing the heat-shield plate was set at a value of 0.9. The temperature gradient G when an after-cooler was not installed was the minimum value 3.75° C./mm. As shown in FIG. 4, the temperature gradient G increased following the increasing of the surface emissivity value of the after-cooler. For level 3, temperature gradient G reached its maximum value 5.5° C./mm. Therefore, amplifying the temperature gradients in the region near the solid-liquid boundary is best accomplished by increasing the emissivity values of the surfaces of the after-cooler facing both the crystal and the heat-shield plate, and it is incorrect to only mirror-polish the outer surface of the after-cooler facing the heat-shield plate as described in prior arts.

FIG. 5 shows the change in temperature gradients in relation to the variation of emissivity-value levels of an after-cooler in which the emissivity values of both the surfaces facing the crystal and facing the heat-shield plate are the same. Same as in FIG. 4, the temperature gradients G shown in FIG. 5 are measured at temperatures ranging from the melting point to 1300° C. The results show the temperature gradient G in the region near the solid-liquid boundary increase following the increase of the emissivity values of the after-cooler. However, in range of emissivity values between 0.4 to 0.6, the increase of the temperature gradients G was unstable. The temperature gradient G increased dramatically when the emissivity value exceeded 0.6, and the temperature gradient G reached its maximum value 5.5° C./mm when the surface emissivity value of the whole after-cooler was set at a value of 0.9. Hence, it is essential to set the emissivity value higher than 0.6 so as to assure the effect brought about by changing the emissivity value. In the graph, zero emissivity value indicates that no after-cooler was installed, and the temperature gradient G was at its minimum value 3.75° C./mm.

The stainless steel used in the after-cooler of the above embodiment can be austenitic, ferritic, or martensitic. The above stainless steel can be blackened by chemical treatment so as to increase its emissivity value. Furthermore, the emissivity value of the after-cooler can be improved to a value of 0.9 by increasing its surface roughness.

In the single-crystal manufacturing device installed with conventional after-cooler, the lifting speed for an 8-inch single crystal was 1.1 mm/min. However, in the single-crystal manufacturing device installed with the after-cooler of this invention, the lifting speed can be elevated to a value of 1.5 mm/min. In addition, copper was not used in the after-cooler installed in the above embodiment of the single crystal manufacturing device; therefore, crystal defects induced by copper were not found.

According to the above-described, the following effect can be obtained:

(1) By setting the emissivity values of both the inner surface facing the single crystal and the outer surface facing the heat-shield plate of the after-cooler installed in a single-crystal manufacturing device at a value exceeding 0.6, the lifting speed of the single crystal can be increased. Thus, productivity can be enhanced.

(2) If the surface-treatment of the after-cooler is performed by coating or galvanizing, there is a danger of it coming off during CZ process. According to this invention, the film is obtained by oxidizing or nitriding through chemical-dipping or gas-treatment; accordingly, its structure is dense. Therefore, the film will not come off even if it grows at a high operation temperature.

(3) In the process of manufacturing single crystals by the FZ method, the temperature gradients in the crystal-axis direction can also be amplified if an after-cooler similar to that installed in the single-crystal manufacturing device according to this invention is employed. In this case, the productivity can also be enhanced.

What is claimed is:

1. A device for manufacturing single crystals being provided with a heat-shield plate surrounding the single crystal (5) being lifted, characterized in that:

an after-cooler (4), of which both the inner surface facing the single crystal (5) and the outer surface facing the heat-shield plate (1) have surface emissivity value larger than 0.6, is disposed between the single crystal (5) being lifted and the heat-shield plate (1).

2. A device for manufacturing single crystals as claimed in claim 1, wherein the after-cooler (4) is made of cooling pipes or cooling jackets, and the surfaces of the after-cooler (4) are treated by oxidizing or nitriding so as to increase their emissivity values.

* * * * *